(12) United States Patent
Dorhout et al.

(10) Patent No.: US 12,185,537 B2
(45) Date of Patent: Dec. 31, 2024

(54) INTEGRATED STRUCTURES

(71) Applicant: Micron Technology, Inc., Boise, ID (US)

(72) Inventors: Justin B. Dorhout, Boise, ID (US); David Daycock, Boise, ID (US); Kunal R. Parekh, Boise, ID (US); Martin C. Roberts, Boise, ID (US); Yushi Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 644 days.

(21) Appl. No.: 17/378,743

(22) Filed: Jul. 18, 2021

(65) Prior Publication Data

US 2021/0343743 A1 Nov. 4, 2021

Related U.S. Application Data

(63) Continuation of application No. 16/438,334, filed on Jun. 11, 2019, now Pat. No. 11,081,495, which is a
(Continued)

(51) Int. Cl.
| | |
|---|---|
| *H01L 21/00* | (2006.01) |
| *H01L 21/338* | (2006.01) |
| *H01L 27/115* | (2017.01) |
| *H01L 29/66* | (2006.01) |
| *H01L 29/74* | (2006.01) |
| *H01L 29/78* | (2006.01) |
| *H01L 29/80* | (2006.01) |

(Continued)

(52) U.S. Cl.
CPC ....... *H10B 43/27* (2023.02); *H01L 29/66666* (2013.01); *H01L 29/7827* (2013.01); *H01L 29/76* (2013.01)

(58) Field of Classification Search
CPC .......... H01L 27/11582; H01L 29/7926; H01L 27/11556; H01L 27/1157; H01L 27/11578; H01L 21/28282; H01L 27/11565
See application file for complete search history.

(56) References Cited

U.S. PATENT DOCUMENTS

| | | |
|---|---|---|
| 9,455,261 B1 | 9/2016 | Sun et al. |
| 2010/0013049 A1 | 1/2010 | Tanaka et al. |

(Continued)

*Primary Examiner* — Anthony Ho
*Assistant Examiner* — David J Goodwin
(74) *Attorney, Agent, or Firm* — Wells St. John P.S.

(57) ABSTRACT

Some embodiments include an integrated structure having a conductive material, a select device gate material over the conductive material, and vertically-stacked conductive levels over the select device gate material. Vertically-extending monolithic channel material is adjacent the select device gate material and the conductive levels. The monolithic channel material contains a lower segment adjacent the select device gate material and an upper segment adjacent the conductive levels. A first vertically-extending region is between the lower segment of the monolithic channel material and the select device gate material. The first vertically-extending region contains a first material. A second vertically-extending region is between the upper segment of the monolithic channel material and the conductive levels. The second vertically-extending region contains a material which is different in composition from the first material.

31 Claims, 13 Drawing Sheets

Related U.S. Application Data continuation of application No. 16/290,169, filed on Mar. 1, 2019, now Pat. No. 10,355,018, which is a continuation of application No. 15/651,719, filed on Jul. 17, 2017, now Pat. No. 10,256,249, which is a continuation of application No. 14/830,517, filed on Aug. 19, 2015, now Pat. No. 9,741,732.

(51) Int. Cl.
*H10B 43/27* (2023.01)
*H01L 29/76* (2006.01)

(56) References Cited

U.S. PATENT DOCUMENTS

| | | |
|---|---|---|
| 2010/0171163 A1 | 7/2010 | Kim et al. |
| 2010/0213527 A1 | 8/2010 | Shim et al. |
| 2010/0237400 A1 | 9/2010 | Aoyama |
| 2010/0237402 A1 | 9/2010 | Sekine et al. |
| 2011/0012188 A1* | 1/2011 | Kito ............... H10B 43/20 257/E27.081 |
| 2011/0065270 A1 | 3/2011 | Shim et al. |
| 2011/0147824 A1 | 6/2011 | Son et al. |
| 2011/0298013 A1 | 12/2011 | Hwang et al. |
| 2012/0211823 A1 | 8/2012 | Lim et al. |
| 2012/0228697 A1 | 9/2012 | Youm et al. |
| 2012/0280304 A1 | 11/2012 | Lee et al. |
| 2012/0287697 A1 | 11/2012 | Hanzawa et al. |
| 2013/0134492 A1 | 5/2013 | Yang et al. |
| 2014/0003148 A1* | 1/2014 | Sun ............... H01L 29/7926 257/E27.06 |
| 2014/0332875 A1 | 11/2014 | Kim et al. |
| 2015/0076586 A1 | 3/2015 | Rabkin et al. |
| 2015/0179661 A1 | 6/2015 | Huo et al. |
| 2015/0333143 A1 | 11/2015 | Meldrim et al. |
| 2016/0268302 A1 | 9/2016 | Lee et al. |
| 2016/0284719 A1 | 9/2016 | Zhu et al. |
| 2018/0026049 A1 | 1/2018 | Lee et al. |

* cited by examiner

INTEGRATED STRUCTURES

RELATED PATENT DATA

This application resulted from a continuation of U.S. patent application Ser. No. 16/438,334, filed Jun. 11, 2019, which resulted from a continuation of U.S. patent application Ser. No. 16/290,169, filed Mar. 1, 2019, now U.S. Pat. No. 10,355,018, which resulted from a continuation of U.S. patent application Ser. No. 15/651,719, filed Jul. 17, 2017, now U.S. Pat. No. 10,256,249, which resulted from a continuation of U.S. patent application Ser. No. 14/830,517, filed Aug. 19, 2015, now U.S. Pat. No. 9,741,732, all of which are incorporated herein by reference.

TECHNICAL FIELD

Integrated structures having vertically-stacked conductive levels over select devices.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured to comprise vertically-stacked memory cells. It is desired to develop improved NAND architecture, and improved methods of forming NAND architecture.

DETAILED DESCRIPTION OF THE ILLUSTRATED EMBODIMENTS

In some embodiments, integrated structures comprise monolithic channel material adjacent (or along) at least one select device and adjacent (or along) vertically-stacked memory cells over the select device. Example embodiments are described with reference to FIGS. 1-13.

Figure 1:
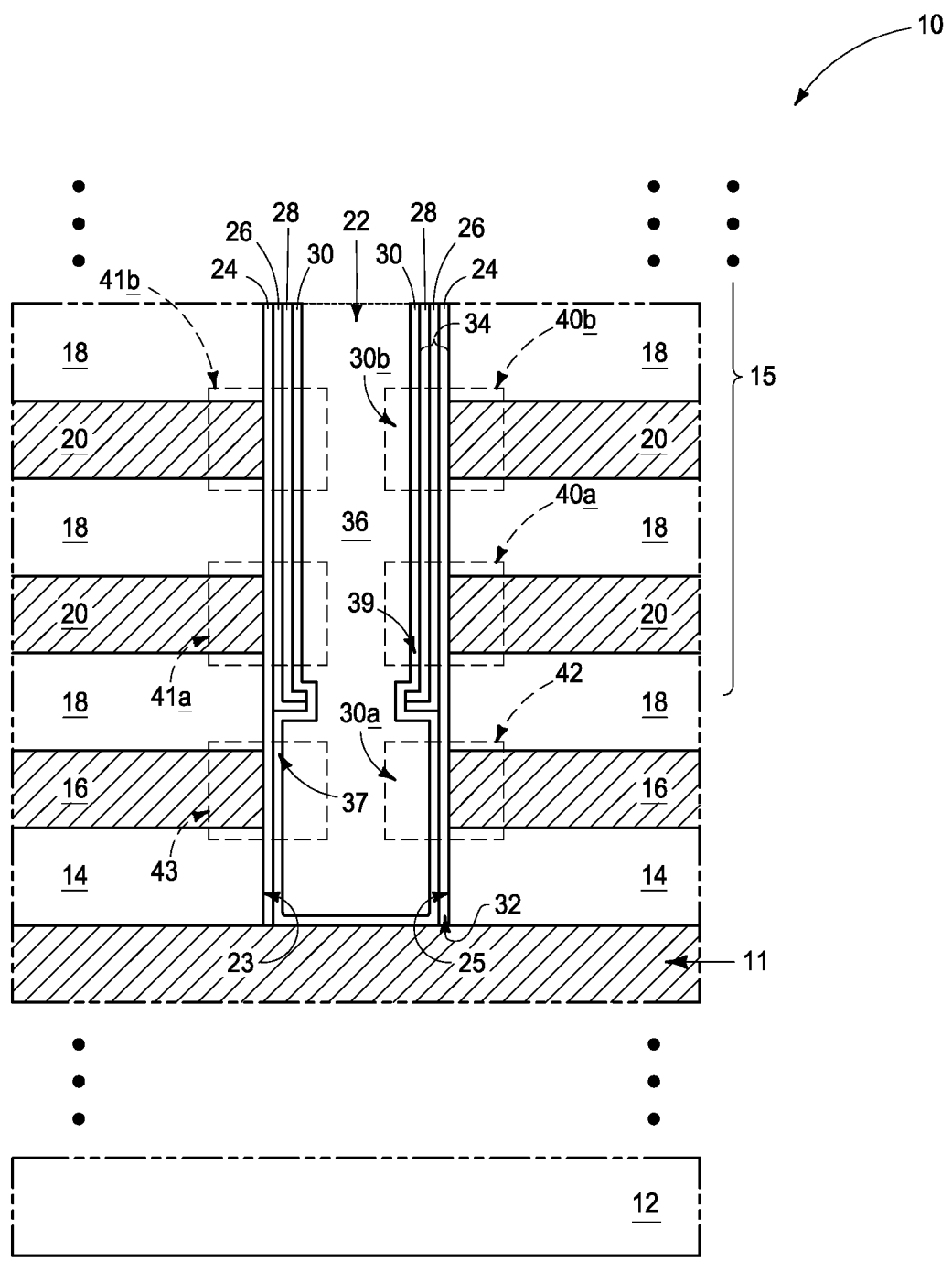
FIGS. 1-5 are diagrammatic cross-sectional views of example embodiment integrated structures.

Referring to FIG. 1, a semiconductor construction (i.e., integrated structure) 10 is shown to comprise a stack 15 of alternating first and second levels 18 and 20. The levels 18 are dielectric, and the levels 20 are conductive. The conductive levels 20 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 20 may comprise n-type doped polycrystalline silicon (i.e., n-type doped polysilicon) of SONOS (semiconductor-oxide-nitride-oxide-semiconductor), or metal of MONOS (metal-oxide-nitride-oxide-semiconductor); with an example MONOS being TANOS (tantalum-alumina-nitride-oxide-semiconductor).

The dielectric levels 18 may comprise any suitable composition or combination of compositions; and may, for example, comprise silicon dioxide.

The levels 18 and 20 may be of any suitable thicknesses; and may, for example, have thicknesses within a range of from about 5 nm to about 300 nm. The levels 18 may be of different thickness than the levels 20, or may be the same thickness as the levels 20.

The stack is over select device gate material 16. The select device gate material 16 may comprise any suitable electrically conductive composition or combination of compositions; and may, for example, comprise conductively-doped semiconductor material, metal and/or metal-containing compositions.

The select device gate material is over insulative material 14. Material 14 may comprise, for example, one or more oxides; such as, for example, one or more of silicon dioxide, aluminum oxide, hafnium oxide, etc.

Insulative material 14 is over a conductive structure (e.g., line) 11. The conductive structure may comprise any suitable electrically conductive material; and may, for example, comprise one or more of metal (e.g., copper, titanium, tungsten, etc.), metal-containing composition (e.g., metal carbide, metal nitride, metal silicide, etc.) and conductively-doped semiconductor material (e.g., conductively-doped silicon, conductively-doped germanium, etc.).

Although one insulative material 14 is shown between the conductive structure 11 and the select device gate material 16, in other embodiments there may be multiple insulative materials between the conductive structure and the select device gate material.

The conductive structure 11 is supported by a base 12. A break is provided between the structure 11 and the base 12 to indicate that there may be additional materials and/or integrated circuit structures between the base and the structure 11. Also, it is to be understood that in some embodiments the conductive structure 11 may be part of the base (e.g., may be a conductively-doped region of the bulk silicon of a wafer).

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

An opening 22 extends through stack 15, select device gate material 16 and insulative material 14. The opening has opposing substantially vertical sidewalls 23 and 25 in the cross-sectional view of FIG. 1.

A first dielectric material 24 extends vertically adjacent (i.e., along) the sidewalls 23 and 25; and is adjacent the conductive levels 20 of stack 15, as well as adjacent the select device gate material 16. The first dielectric material may comprise any suitable composition, and may, for example, comprise silicon dioxide, aluminum oxide (i.e., alumina), hafnium oxide, zirconium oxide, etc. In some embodiments (not shown), the illustrated first dielectric material be replaced with two or more materials; with one of the materials being adjacent the bottom of opening 22 (e.g., adjacent select device gate material 16), and another of the materials being higher in the opening (e.g., adjacent the conductive levels 20 of stack 15). Accordingly, the illustrated dielectric material 24 may be replaced with at least two different dielectric materials in a one-atop-the-other configuration.

A second dielectric material 26 is adjacent the first dielectric material 24, and is spaced from the conductive levels 20 by the first dielectric material. The second dielectric material 26 is only within an upper portion of opening 22, and not within a lower portion of the opening. Specifically, the second dielectric material extends along the conductive levels 20 of stack 15, but does not extend along the select device gate material 16. The second dielectric material may comprise any suitable composition, and may, for example, comprise charge trapping materials, such as silicon nitride, silicon oxynitride, etc.

A third dielectric material 28 is adjacent the second dielectric material 26, and is spaced from the conductive levels 20 by the first and second dielectric materials. The third dielectric material 28 is only within the upper portion of opening 22; and thus extends along the conductive levels 20 of stack 15, but not along the select device gate material 16. The third dielectric material may comprise any suitable composition, and may, for example, comprise silicon dioxide, aluminum oxide, hafnium oxide, zirconium oxide, etc.

A channel material 30 is adjacent the third dielectric material 28, and is spaced from the conductive levels 20 by the first, second and third dielectric materials. The channel material also extends into a bottom of opening 22 along the select device gate material 16, and is spaced from the select device gate material by the first dielectric material 24.

In some embodiments, the channel material 30 may be considered to be a vertically-extending monolithic channel material, at least as pertains to regions of the channel material adjacent sidewalls 23 and 25. Specifically, the monolithic channel material extends vertically along the conductive layers 20 of stack 15, and along the select device gate material 16. The monolithic channel material may be considered to have a lower segment 30a adjacent the select device gate material, and to have an upper segment 30b adjacent the conductive levels 20 of stack 15. The dielectric material 24 may be considered to be a first material of a first vertically-extending region 32; with such first vertically-extending region being between the select device gate material 16 and the lower segment 30a of the channel material. Similarly, the dielectric materials 24, 26 and 28 may be considered together as forming a second vertically-extending region 34; with such second vertically-extending region being between the conductive levels 20 and the upper segment 30b of the channel material.

In the embodiment of FIG. 1, the second vertically-extending region 34 has at least one different material than the first vertically extending region 32, and is horizontally thicker than the first vertically-extending region.

The channel material 30 forms vertically-extending liners adjacent the sidewalls of opening 22, and an insulator 36 is within a central region of the opening between the vertically-extending liners of material 30. The insulator 36 may include gas (for instance, air). Additionally, or alternatively, the insulator may include semisolid or solid material (for instance, silicon dioxide, silicon nitride, etc.). In some embodiments, the channel material 30 may be considered to form a first vertically-extending liner 37 along sidewall 23 of opening 22, and to form a second vertically-extending liner 39 along the other sidewall 25 of the opening. Each vertically extending liner may be considered to have one side contacting insulator 36, and a second side in opposing relation to said one side; with the second side contacting dielectric materials 24 and 28.

The various materials 24, 26 and 28, together with regions of conductive levels 20 and channel material 30, form a first series of vertically-stacked memory cells 40a and 40b, and a second series of vertically-stacked memory cells 41a and 41b. The vertically-stacked memory cells 40a and 40b may be considered to form a first NAND string, and the vertically-stacked memory cells 41a and 41b may be considered to form a second NAND string.

The number of memory cells in each NAND string is determined by the number of conductive levels 20. The stack may comprise any suitable number of conductive levels. In some embodiments, the stack 15 may comprise 8 conductive levels, 16 conductive levels, 32 conductive levels, 64 conductive levels, 1024 conductive levels, etc.

The select device gate material 16, together with dielectric material 24 and the channel material 30, forms select devices 42 and 43. Such select devices may be source-side select gates (SGS) or drain-side select gates (SGDs). In some applications the memory cells 40a, 40b, 41a and 41b are part of a memory array formed over CMOS (complementary-metal-oxide-semiconductor) circuitry. The select devices 42 and 43 are single-gated MOS (metal-oxide-semiconductor) devices. Such single-gated MOS may advantageously enable utilization of GIDL (gate-induced-drain-leakage) current injection for an erase operation tailored for the CMOS-under-array architecture.

Figure 2:
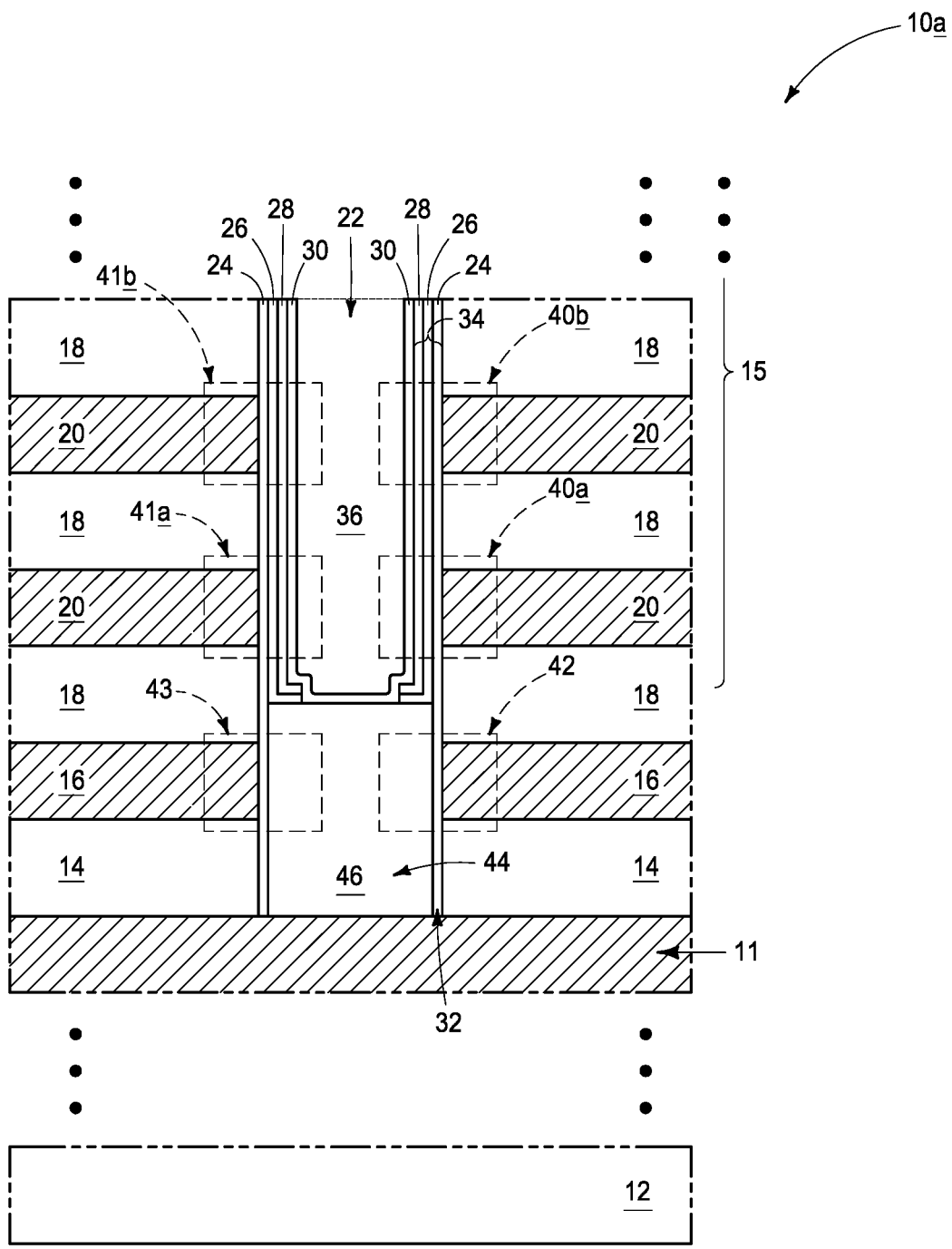

The embodiment of FIG. 1 shows the channel material 30 directly contacting the conductive structure 11. In other embodiments the channel material may be spaced from the conductive structure by one or more conductive materials of a conductive plug. For instance, FIG. 2 shows a construction 10a having a conductive plug 44. The conductive plug is within a bottom region of opening 22, with an uppermost surface of the plug being beneath the lowestmost conductive level 20 of stack 15. In the embodiment of FIG. 2, the conductive plug extends along the entirety of the first vertically extending region 32 described above with reference to FIG. 1, and accordingly the plug has an uppermost surface above select device gate material 16.

The conductive plug 44 comprises conductive material 46. Such conductive material may be homogeneous (as shown) or may comprise two or more different layers. The conductive material may comprise any suitable composition or combination of compositions; including, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). In some embodiments, the conductive material of structure 11 may be referred to as a first conductive material, and the conductive material 46 of the plug may be referred to as a second conductive material.

Regions of the conductive material 46 of plug 44 are channel material of MOS devices 42 and 43, and it may be desired that at least such regions comprise semiconductor material (e.g., silicon, germanium, etc.).

In some embodiments, the channel material 30 may comprise, consist essentially of, or consist of a first composition; and the conductive material 46 of plug 44 may comprise, consist essentially of, or consist of a second composition. The second composition may be the same as the first composition (for instance, both may comprise silicon), or the second composition may be different from the first composition (for instance, the second composition may comprise germanium while the first composition comprises silicon; the second composition may comprise silicon and germanium while the first composition consists of silicon, etc.).

Figure 3:
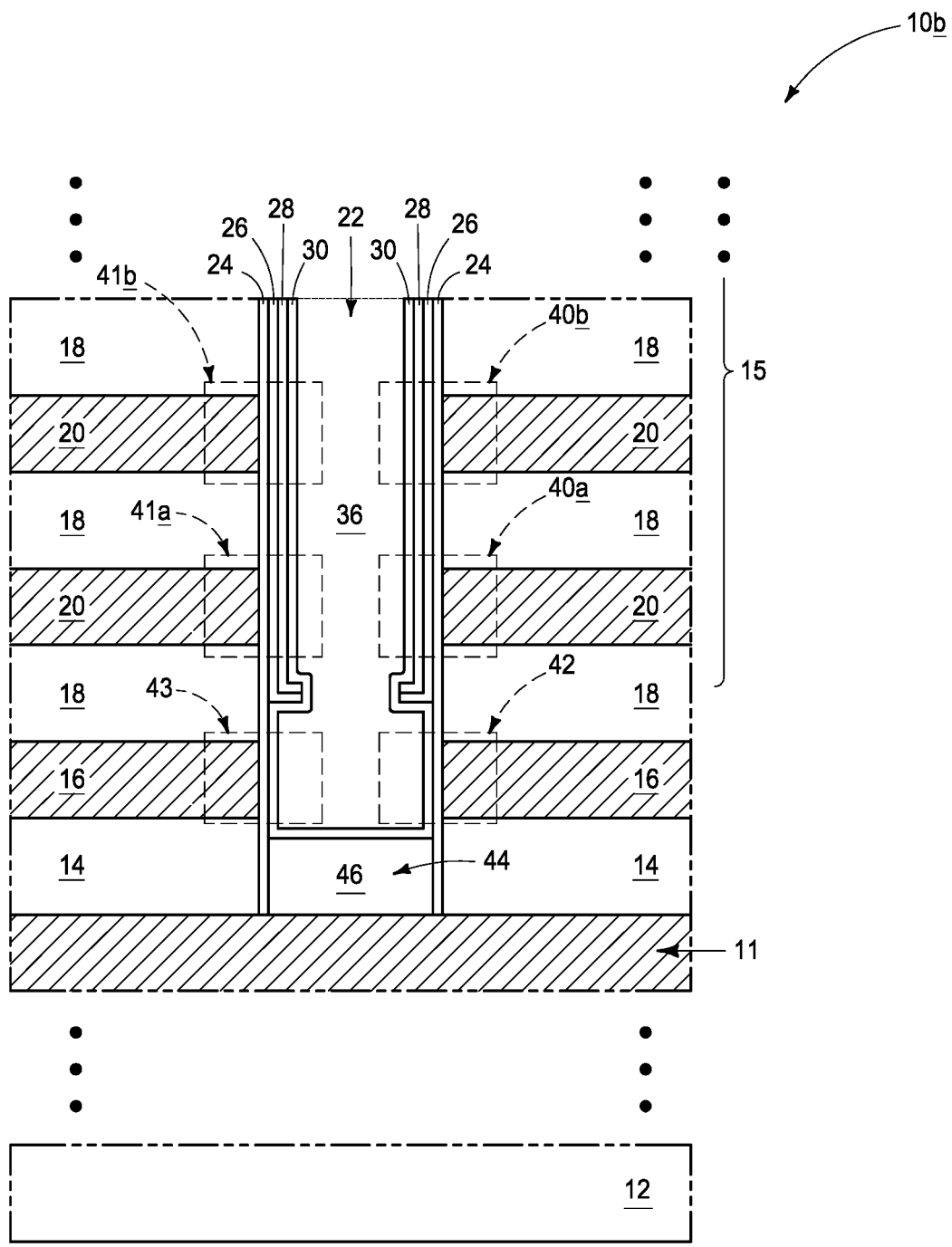

FIG. 3 shows another construction (10b) having a conductive plug 44 between the channel material 30 and the conductive structure 11. The embodiment of FIG. 3 differs from that of FIG. 2 in that the conductive plug has an upper surface beneath the select device gate material 16. Accordingly, the conductive material 46 of the plug is not utilized as channel material of MOS devices 42 and 43.

In some embodiments, the constructions of FIGS. 1-3 may be considered to comprise first channel regions along the conductive levels 20 and second channel regions along the select device gate material 16. The first and second channel regions comprise a same composition as one another and together form monolithic channel material across the conductive levels and the select device gate material in the constructions of FIGS. 1 and 3. In contrast, the first and second channel regions may comprise different compositions relative to one another in the construction of FIG. 2 (with the first channel region along the select device gate material comprising material 46, and the second channel region along conductive levels 20 comprising material 30). A first vertically-extending dielectric region is between the first channel region and the select device gate material in each of the constructions of FIGS. 1-3, with the first vertically-extending dielectric region comprising the material 24. Also, a second vertically-extending dielectric region is between the second channel region and the conductive levels in each of the constructions of FIGS. 1-3, with the second vertically-extending dielectric region comprising the vertically-extending materials 24, 26 and 28.

Figure 4:
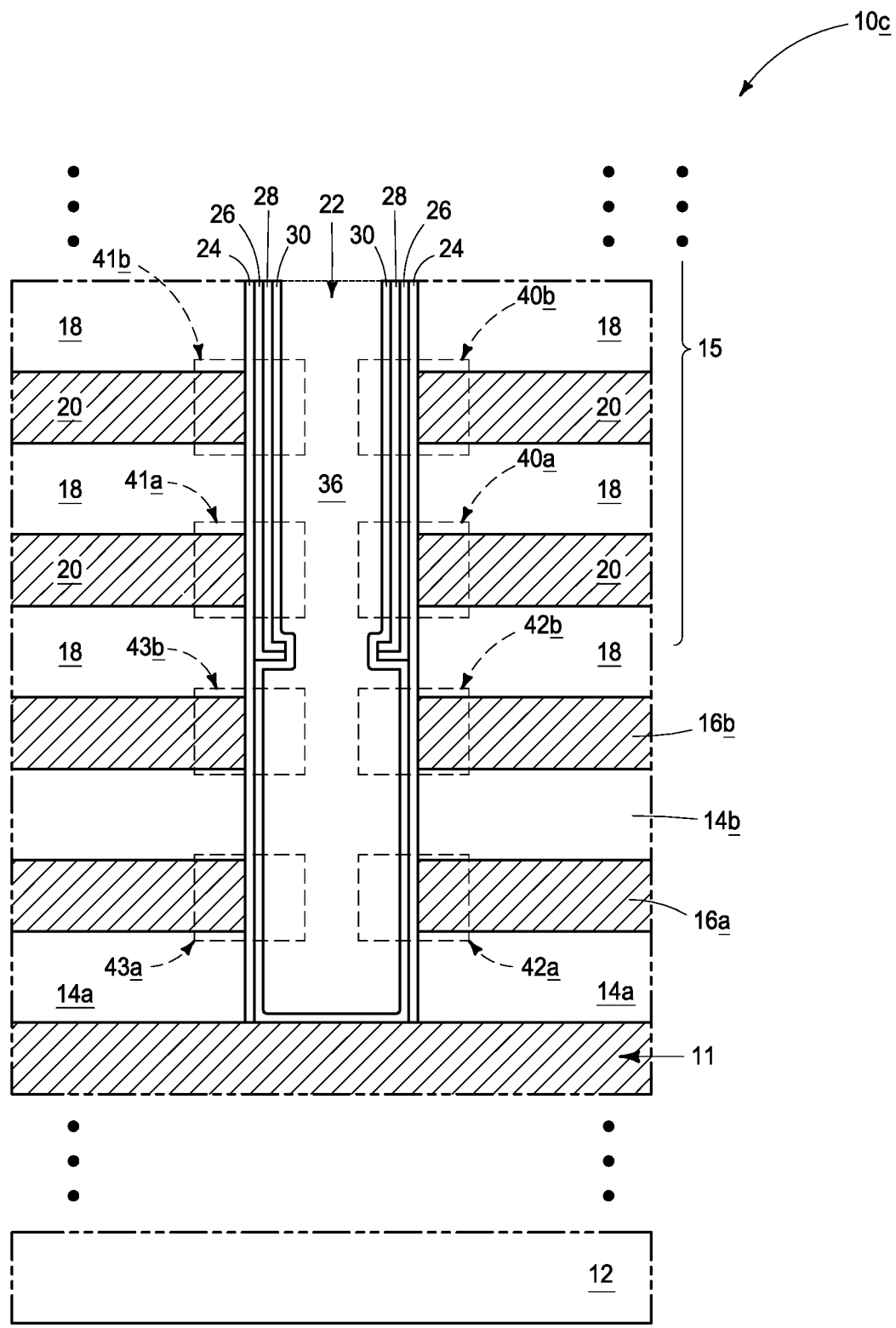

The embodiments of FIGS. 1-3 show single select gate devices under vertical strings of memory cells. In other embodiments, two or more select gate devices may be utilized. For instance, FIG. 4 shows a construction 10c similar to that of FIG. 1 but comprising two vertically-stacked select gate device materials 16a and 16b. The materials 16a and 16b may be the same composition as one another, or may be of different compositions relative to one another.

The construction 10c comprises dielectric materials 14a and 14b; with material 14a being between select gate device material 16a and conductive structure 11, and with material 14b separating the select device gate materials from one another. The materials 14a and 14b may be the same composition as one another, or may be of different compositions relative to one another.

The embodiment of FIG. 4 is similar to that of FIG. 1, in that the channel material 30 directly contacts the conductive structure 11. In other embodiments, multiple select gate arrangements of the type described with reference to FIG. 4 may be utilized in conjunction with conductive plugs 44 of the types described with reference to FIGS. 2 and 3.

Figure 5:
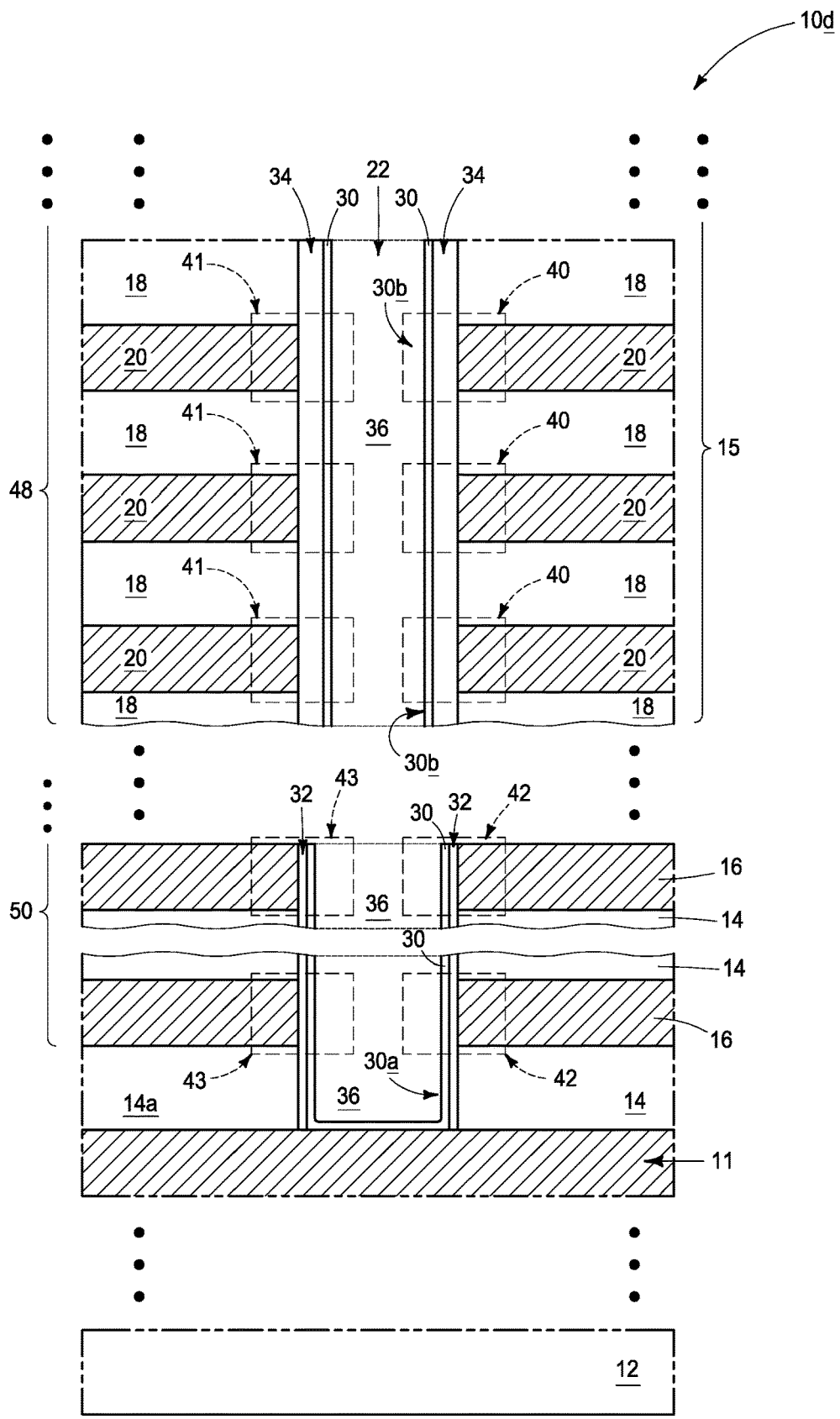

The vertically-stacked select gate device materials are incorporated into two sets of vertically-stacked select gate devices; with one set being the devices 42a and 42b, and the other set being the devices 43a and 43b. The devices within each set (for instance, devices 42a and 42b) may be electrically coupled with one another so that they are operated as a single entity, or may be electrically uncoupled relative to one another so that they may be operated separately and independently of one another. Although each set of select devices is shown comprising two devices in the embodiment of FIG. 4, in other embodiments the sets may comprise more than two devices. FIG. 5 shows a construction 10d which more generically illustrates the various arrangements of memory cells and select devices of the embodiment of FIG. 4.

The construction 10d comprises a vertically-stacked memory region 48 over a select device region 50. The memory region comprises a plurality of vertically-stacked memory cells 40 and 41, and the select device region comprises a plurality of select devices 42 and 43. The select device region comprises vertically-stacked conductive levels 16, alternating with vertically-stacked insulative levels 14. At least two of the conductive levels 16 may comprise a same composition as one another and/or at least two of the conductive levels 16 may comprise a different composition relative to one another. Also, at least two of the insulative levels 14 may comprise a same composition as one another and/or at least two of the insulative levels 14 may comprise a different composition relative to one another.

Channel material 30 extends monolithically through the vertically-stacked memory region and through the select device region. The channel material comprises a first (lower) segment 30a spaced from the conductive levels 16 of the select device region by first vertically-extending region 32, and comprises a second (upper) segment 30b spaced from conductive levels 20 of the vertically-stacked memory region by second vertically-extending region 34. The vertically-extending regions 32 and 34 may comprise dielectric materials (for instance, the dielectric materials 24, 26 and 28 described above with reference to FIGS. 1-4). The region 34 is horizontally thicker than the region 32 due to region 34 comprising more materials than region 32 (for instance, region 34 may comprise the vertically-extending materials 24, 26 and 28, while region 32 comprises only the vertically-extending material 24; as shown in FIG. 1).

The select device region comprises two sets of vertically-stacked select devices (with one set comprising devices 42, and the other set comprising devices 43). Each set is shown comprising two devices, but broken lines are provided within the select device region to indicate that there may be more than the illustrated number of devices within each set. For instance, in some embodiments there may be three select devices with each set, four select devices within each set, etc. If multiple select devices are within a vertically-extending set, at least two of the devices may be electrically coupled with one another and utilized as a common unit and/or at least two of the devices may be operated separately and independently of one another.

The embodiment of FIG. 5 is similar to that of FIG. 1, in that the channel material 30 directly contacts the conductive structure 11. In other embodiments, the arrangement of FIG. 5 may be utilized in conjunction with conductive plugs 44 of the types described with reference to FIGS. 2 and 3.

Although the embodiments of FIGS. 1-5 show channel material 30 configured as a liner which partially fills opening 22 to leave a hollow within the opening (with such hollow being filled with insulator 36), in other embodiments the channel material may entirely fill opening 22.

The structures described with reference to FIGS. 1-5 be formed utilizing any suitable processing. Example processing is described with reference to FIGS. 6-13.

Figure 6:
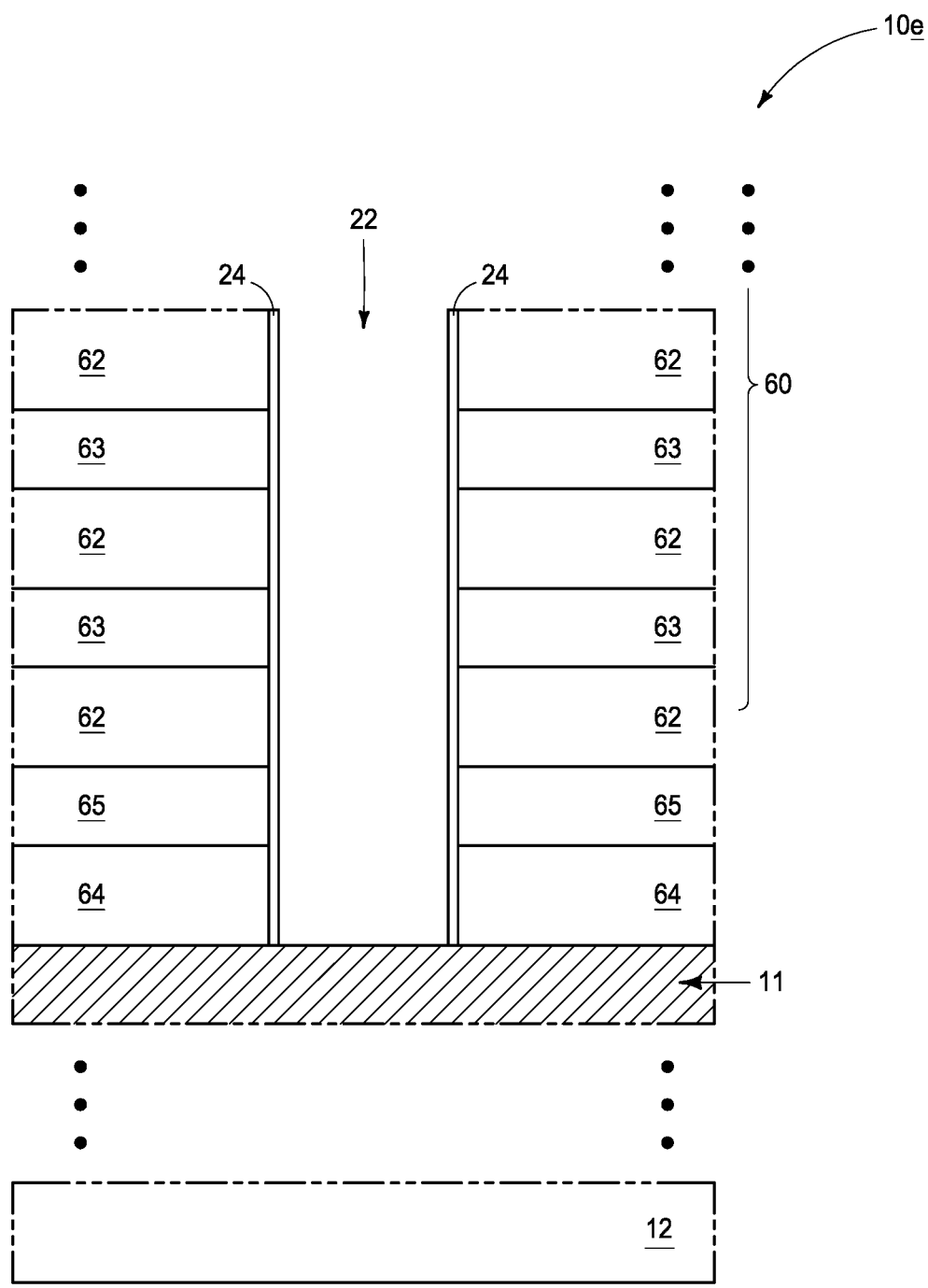
FIGS. 6-11 are diagrammatic cross-sectional views of example embodiment process stages utilized in fabricating an example embodiment integrated structure.

Referring to FIG. 6, a construction 10e comprises a stack 60 with alternating levels 62 and 63. The levels 62 and 63 may be identical to the levels 18 and 20 of FIG. 1, or may be different.

The construction also comprises a material 64 over conductive structure 11, and a material 65 over the material 64. The materials 64 and 65 may be the same as materials 14 and 16 of FIG. 1, or may be different.

Opening 22 is formed through materials 62, 63, 64 and 65, and the sidewalls of the opening are lined with dielectric material 24. The material 24 does not extend across a bottom of opening 22. Such configuration may be achieved by, for example, utilizing an anisotropic etch after deposition of material 24.

Figure 7:
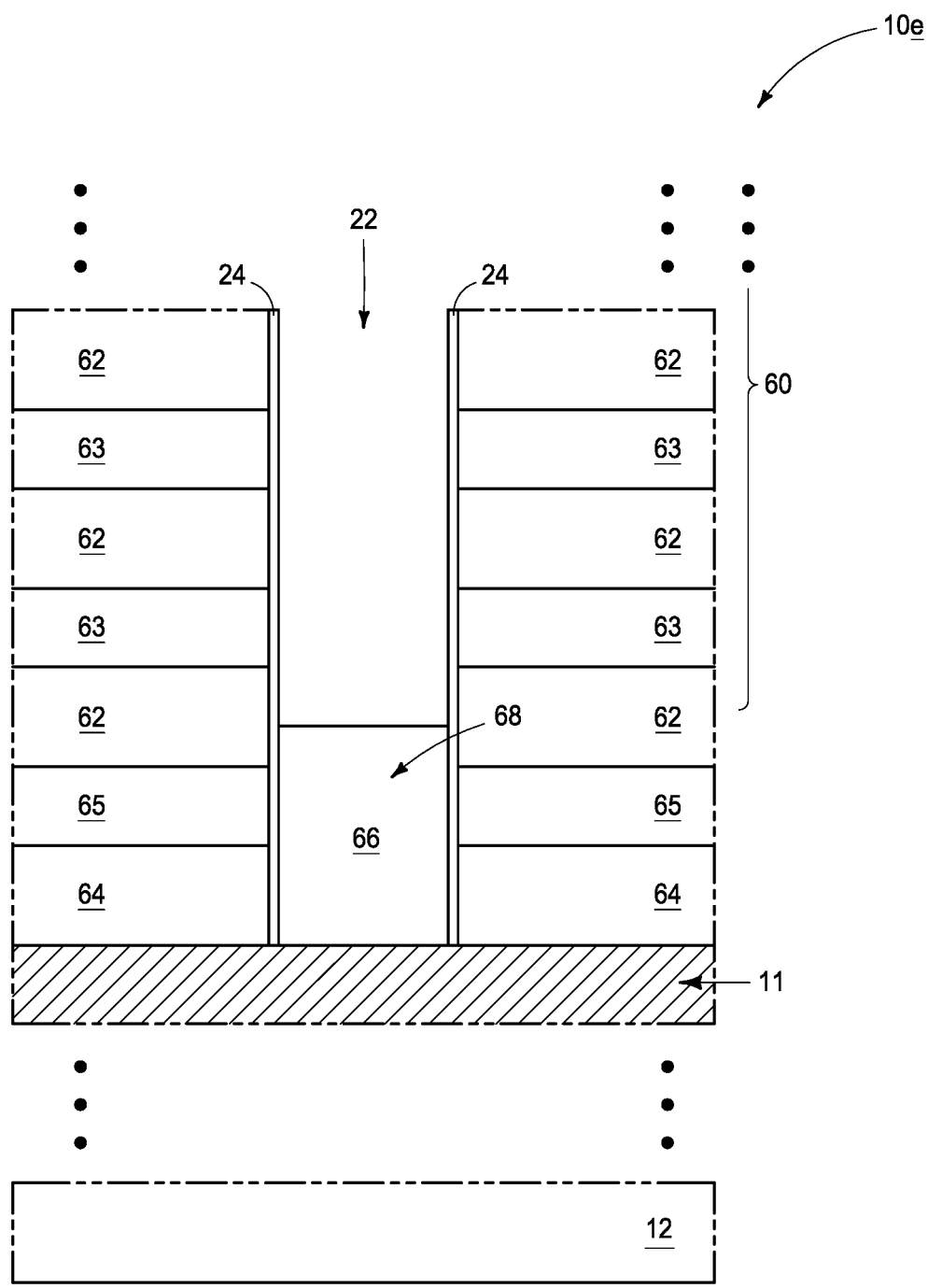

Referring to FIG. 7, material 66 is provided at a bottom of opening 22 to form a plug 68. The material 66 may be a same composition as the material 46 described above with reference to FIG. 2, or may be different. In some embodiments, material 66 is sacrificial, and accordingly may comprise anything suitable for being deposited and removed relative to other materials of construction 10e. In other embodiments, material 66 becomes the plug 44 of FIGS. 2 and 3, and accordingly may comprise any of the conductive compositions described above as being suitable for such plug.

Figure 8:
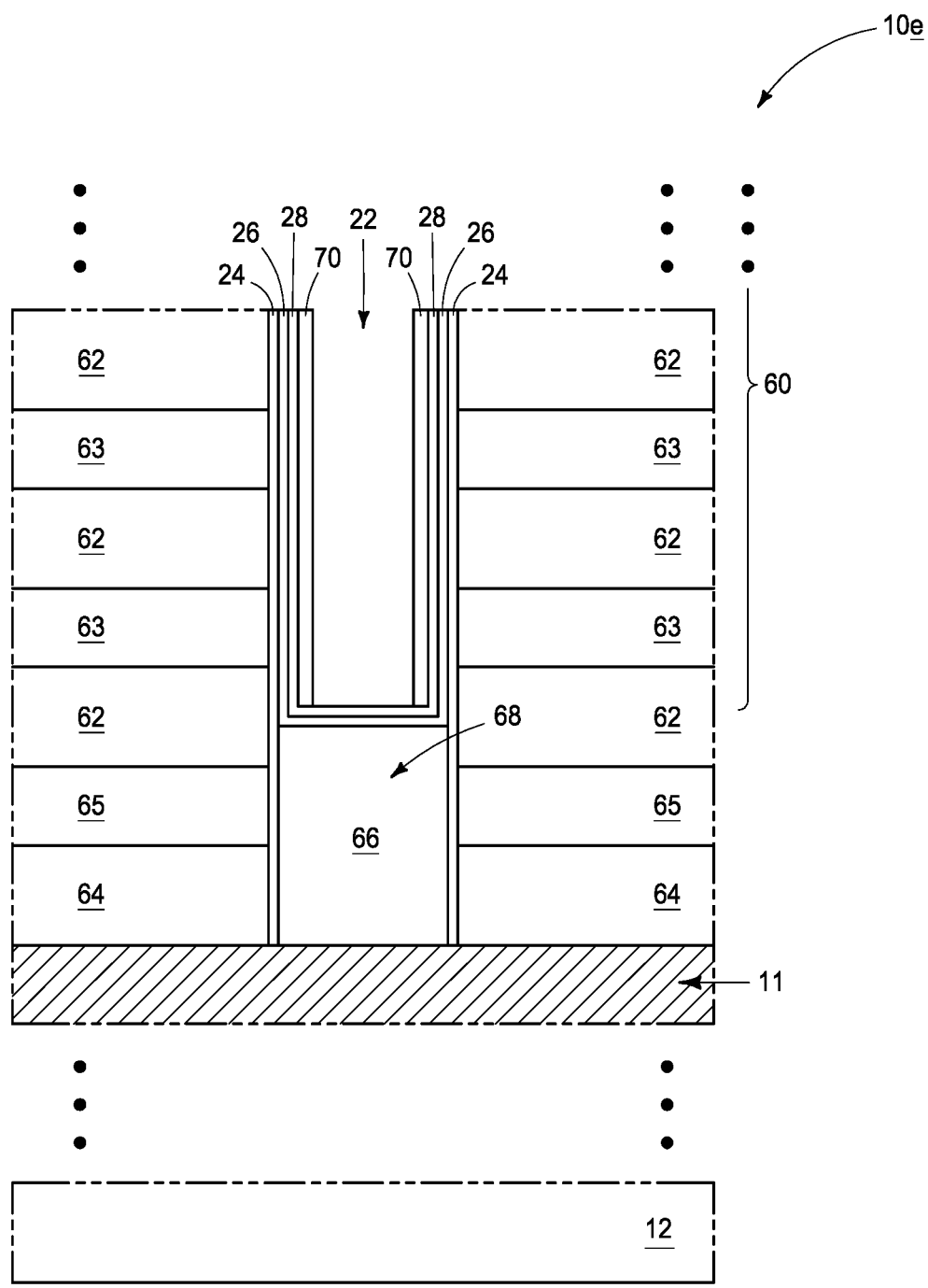

Referring to FIG. 8, materials 26 and 28 are deposited within opening 22, and a protective spacer 70 is formed along material 28. The protective spacer may comprise any suitable composition. The protective spacer extends along vertical sidewalls of opening 22, but not along a bottom of the opening. The protective spacer may be formed in such configuration utilizing anisotropic etching subsequent to deposition of material of spacer 70.

The spacer 70, together with materials 24, 26 and 28, narrows the opening 22.

Figure 9:
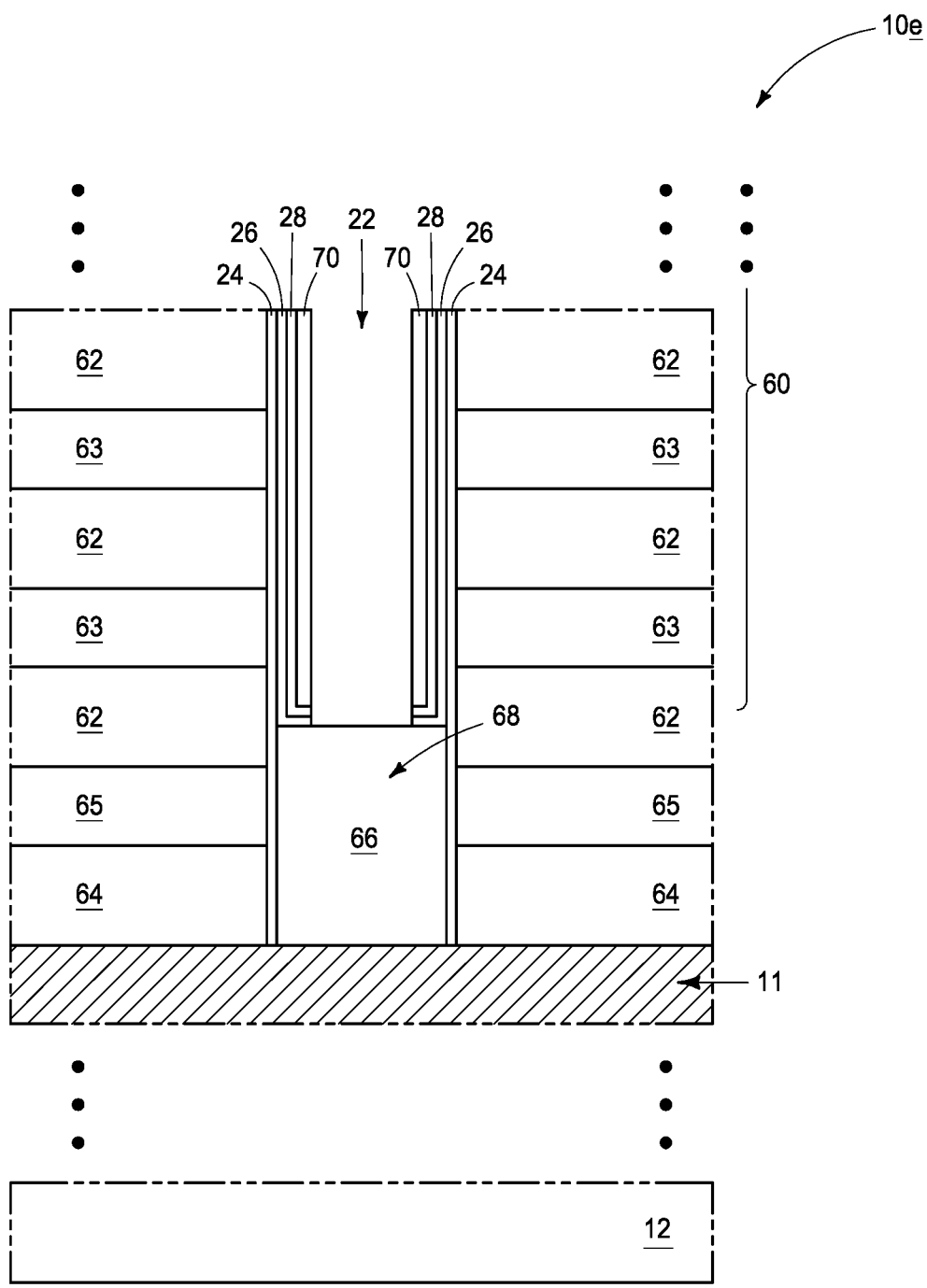

Referring to FIG. 9, the narrowed opening is extended through materials 26 and 28 with one or more etches. The extension of the narrowed opening through materials 26 and 28 exposes plug material 66.

Figure 10:
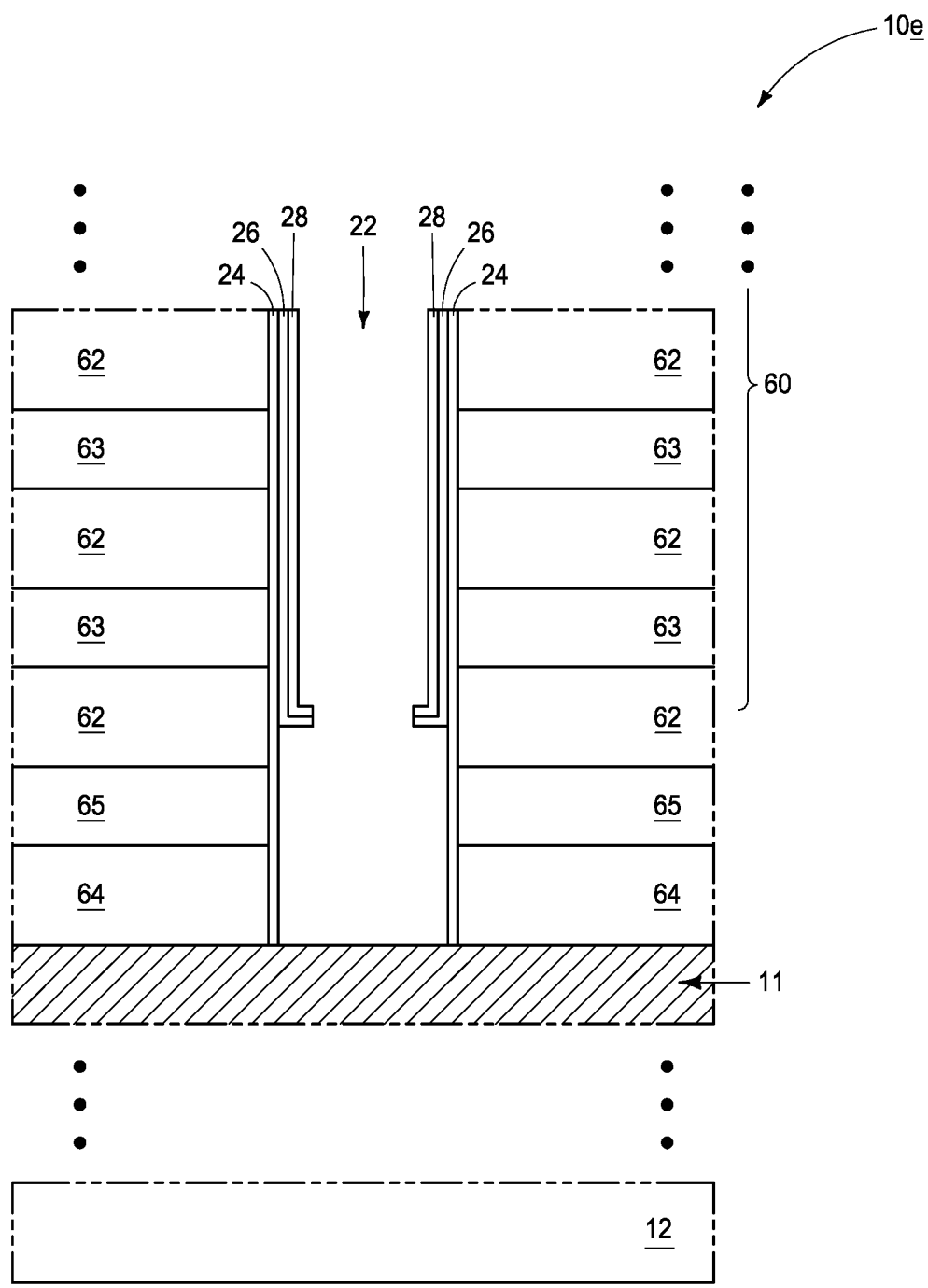

Referring to FIG. 10, protective material 70 and plug material 66 (FIG. 9) are removed. In some embodiments, the protective material and plug material comprise a same composition as one another to simplify the removal of such materials. For instance, in some embodiments the protective material and plug material both comprise silicon.

Figure 11:
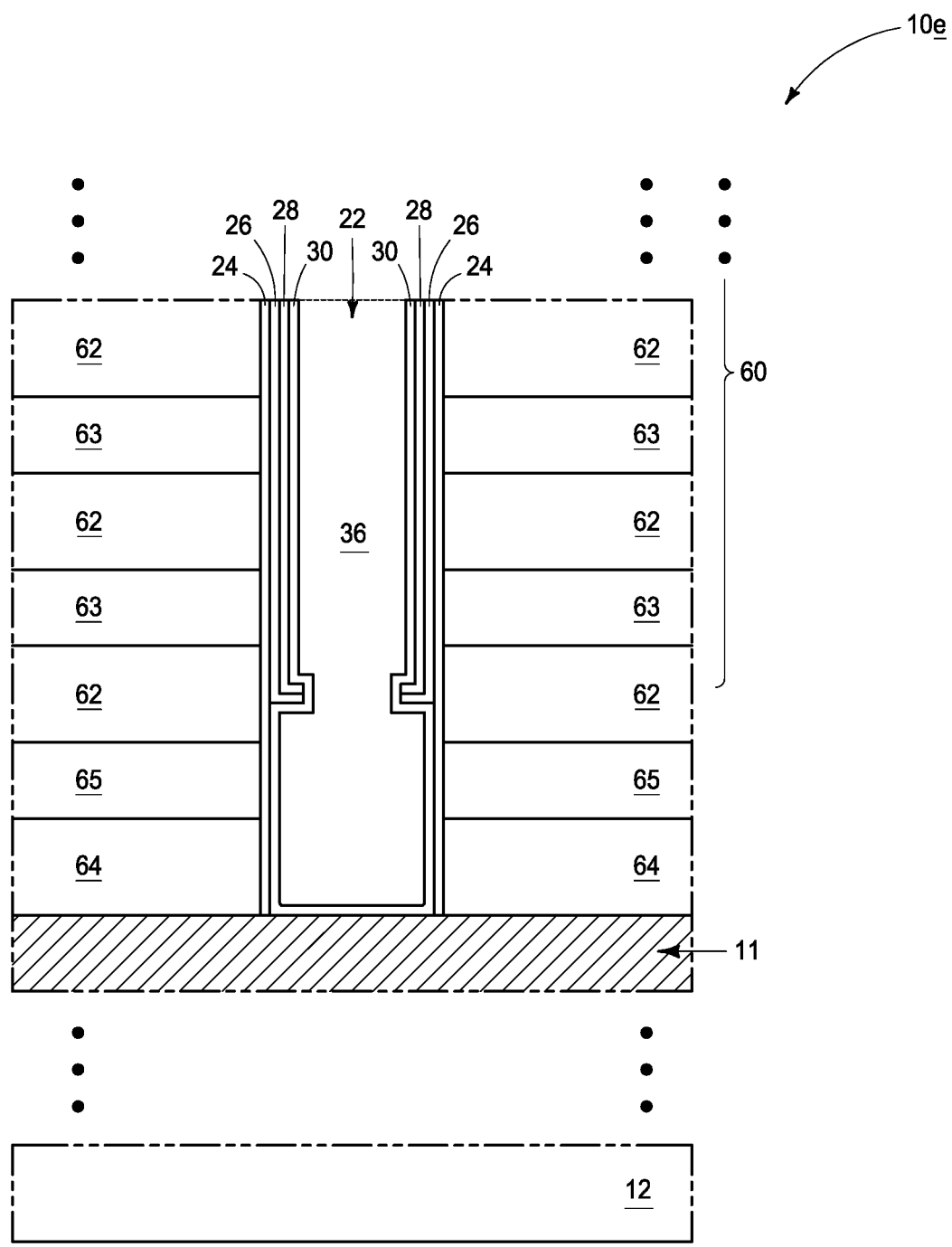

Referring to FIG. 11, channel material 30 is formed within opening 22. Insulator 36 is also shown within the opening. If the insulator is simply air, then the insulator does not have to be separately provided after formation of channel material 30. If instead the insulator is dielectric material (for instance, silicon dioxide), the dielectric material may be provided with a deposition following the deposit of material 30.

The construction of FIG. 11 may be identical to that of FIG. 1 if the materials 62 and 63 are the same as materials 18 and 20 of FIG. 1, and if materials 64 and 65 are the same as materials 14 and 16 of FIG. 1. However, in some embodiments materials 65 and 63 may correspond to a sacrificial material which is ultimately replaced with conductive material corresponding to the conductive levels 16 and 20 of FIG. 1. For instance, the material 65 and 63 may be replaced with tantalum-containing material to form metal-containing conductive levels 16 and 20 in some embodiments.

The processing stage of FIG. 10 shows plug material 66 (FIG. 9) entirely removed. In other embodiments, the plug material may remain, and be incorporated into a construction of the type shown in FIG. 2 or of the type shown in FIG. 3. For instance, FIG. 12 shows an alternative processing stage to that of FIG. 10, and shows some of the plug material 66 remaining as a plug 68.

Figure 12:
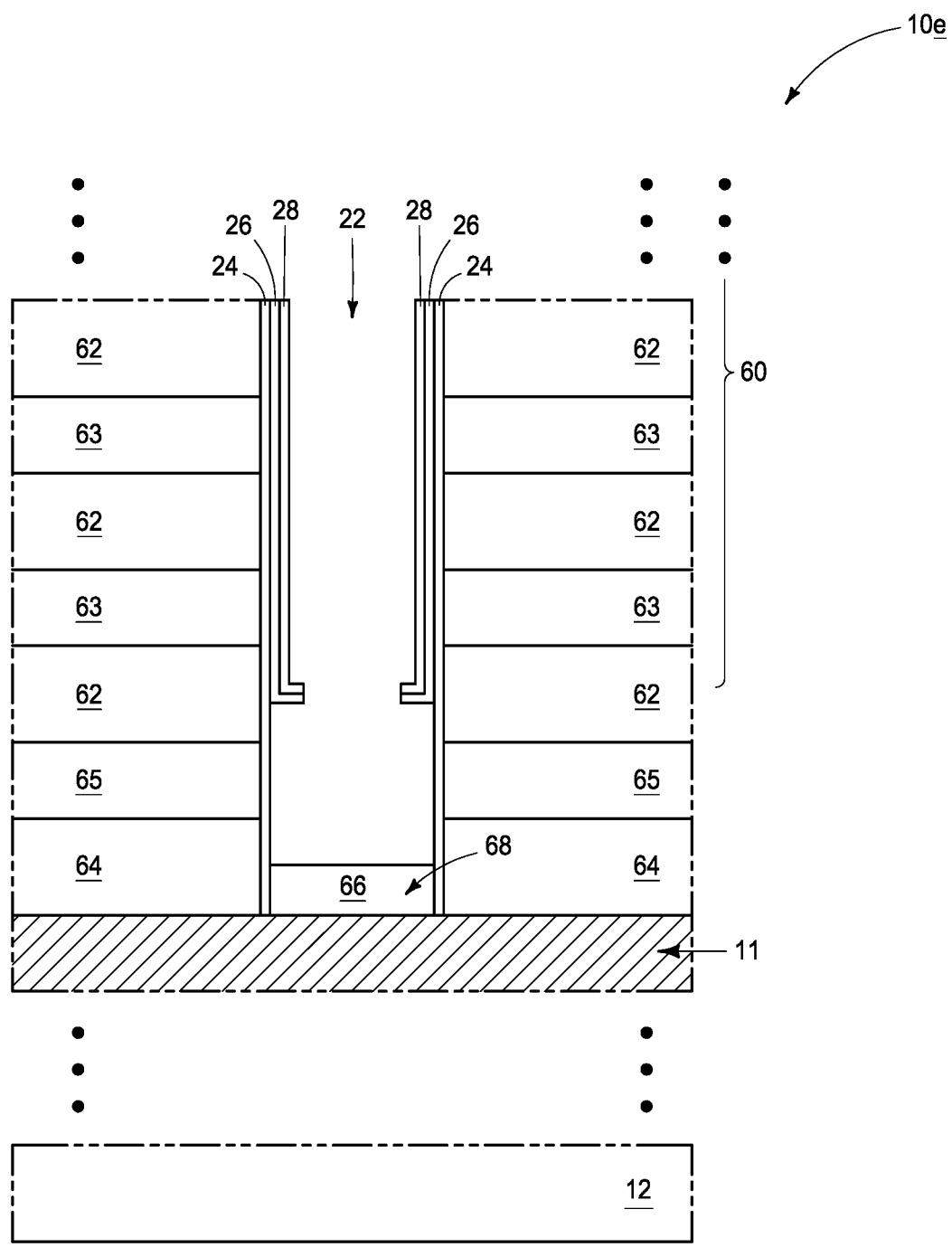
FIGS. 12 and 13 are diagrammatic cross-sectional views of example embodiment process stages utilized in fabricating another example embodiment integrated structure. The process stage of FIG. 12 may follow that of FIG. 9.
Figure 13:
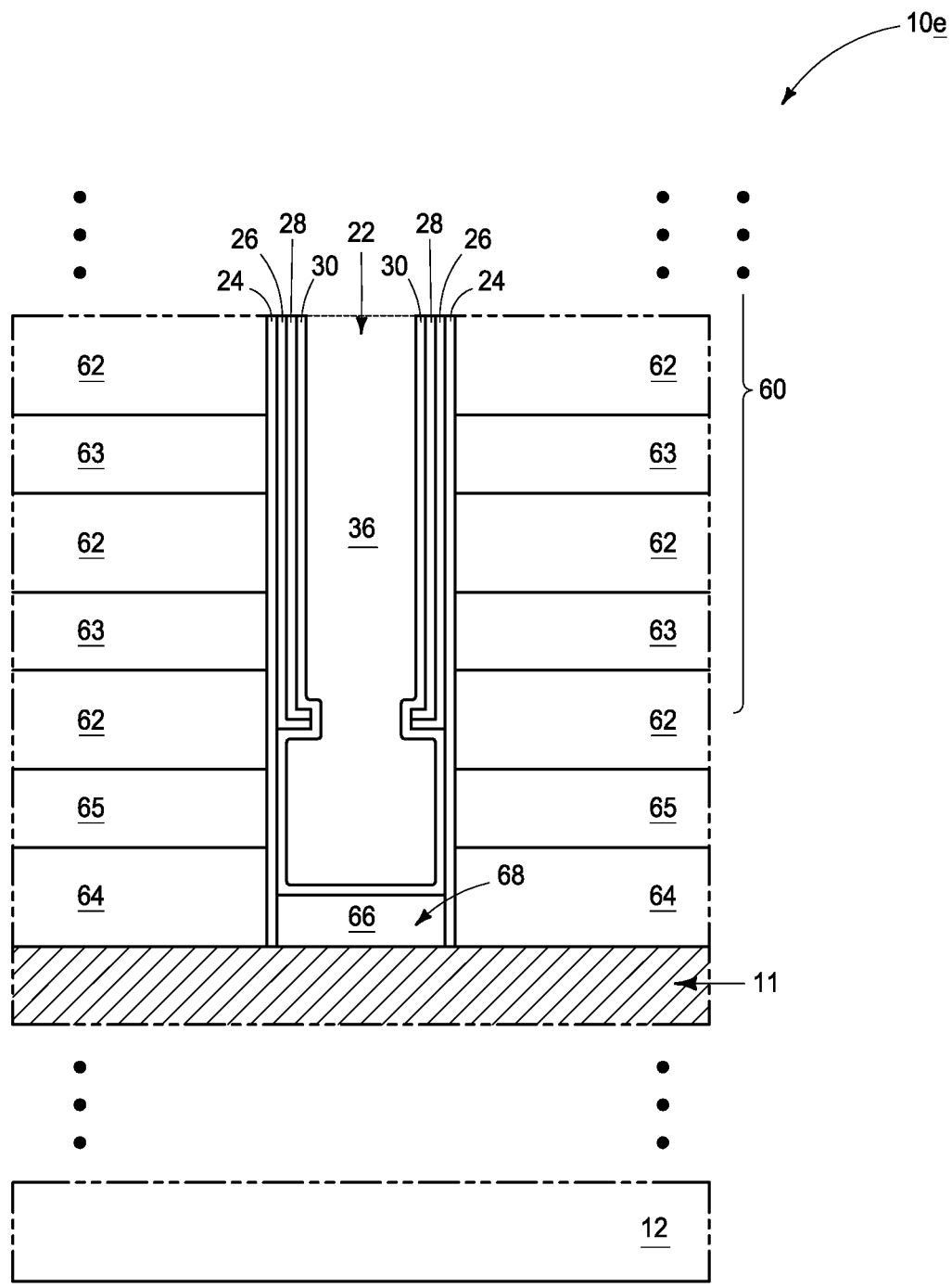

FIG. 13 shows a processing stage subsequent to that of FIG. 12, and shows the channel material 30 and insulator 36 formed within opening 22. The construction of FIG. 13 may be identical to that of FIG. 3 if the materials 62 and 63 are the same as the materials 18 and 20 of FIG. 3, if materials 64 and 65 are the same as materials 14 and 16 of FIG. 3, and if the plug material 66 is the same as the plug material 46 of FIG. 3. In some embodiments, materials 65 and 63 may correspond to sacrificial material which is ultimately replaced with conductive materials corresponding to the levels 16 and 20 of FIG. 3.

The structures described above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure having a conductive material, a select device gate material over the conductive material and spaced from the conductive material by one or more insulative materials, and vertically-stacked conductive levels over the select device gate material. Vertically-extending monolithic channel material is adjacent the select device gate material and the conductive levels. The monolithic channel material contains a lower segment along the select device gate material and an upper segment along the conductive levels. A first vertically-extending region is between the lower segment of the monolithic channel material and the select device gate material. The first vertically-extending region contains a first material. A second vertically-extending region is between the upper segment of the monolithic channel material and the conductive levels. The second vertically-extending region contains one or more vertically-extending materials which are different in composition from the first material.

Some embodiments include an integrated structure having a conductive material, two or more select devices over the conductive material, and vertically-stacked conductive levels over the select devices. Vertically-extending monolithic channel material contains a lower segment adjacent the select devices and an upper segment adjacent the conductive levels. A first vertically-extending region is between the lower segment of the monolithic channel material and gates of the select devices. The first vertically-extending region comprises a first material. A second vertically-extending region is between the upper segment of the monolithic channel material and the conductive levels. The second vertically-extending region comprises one or more vertically-extending materials which are different in composition from the first material.

Some embodiments include an integrated structure having a conductive material, a select device gate material over the conductive material and spaced from the conductive material by one or more insulative materials, and vertically-stacked conductive levels over the select device gate material. The conductive levels are spaced from one another by intervening dielectric levels and comprise metal. An opening extends through the conductive levels and the select device gate material. The opening has substantially vertical sidewalls which extend adjacent the conductive levels and adjacent the select device gate material. Channel material is adjacent the sidewalls of the opening. The channel material is horizontally spaced from the select device gate material by a first dielectric region, and is horizontally spaced from the conductive levels by a second dielectric region which is compositionally different from the first dielectric region.

Some embodiments include an integrated structure comprising vertically-stacked metal-containing conductive levels over a metal-containing select device gate material. A first channel region is adjacent the select device gate material, and a second channel region is adjacent the conductive levels. A first vertically-extending dielectric region is between the first channel region and the select device gate material, with the first vertically-extending dielectric region comprising a first material. A second vertically-extending dielectric region is between the second channel region and the conductive levels, with the second vertically-extending dielectric region comprising a vertically-extending material which is different in composition from the first material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated structure, comprising:
   a conductive line comprising an upper surface;
   alternating insulative levels and conductive levels vertically stacked over the conductive line;
   an opening defining opposing sidewalls through the alternating insulative levels and conductive levels; and
   a channel liner comprising channel material extending along the opposing sidewalls and against at least a portion of the upper surface of the conductive line.

2. The integrated structure of claim 1 further comprising only one dielectric liner between the channel liner and the alternating insulative levels and conductive levels.

3. The integrated structure of claim 2 wherein the single dielectric liner has a horizontal width in an upper portion of the opening which is greater than a horizontal width in a lower portion of the opening.

4. The integrated structure of claim 2 wherein the single dielectric liner has a horizontal width in an upper portion of the opening which is greater than a horizontal width of the channel liner.

5. The integrated structure of claim 1 further comprising a semiconductor base that is discrete from, and under, the conductive line.

6. The integrated structure of claim 1 wherein the conductive line comprises one or more metals.

7. The integrated structure of claim 6 wherein the one or more metals comprises copper, titanium and tungsten.

8. The integrated structure of claim 1 wherein the conductive line comprises one or more of conductively-doped semiconductor material.

9. The integrated structure of claim 8 wherein the one or more of conductively-doped semiconductor material comprises conductively-doped silicon and conductively-doped germanium.

10. The integrated structure of claim 1 wherein a lowermost conductive level defines a gate for a select device, and further comprising a continuous dielectric liner between the channel liner and the conductive levels including the gate for the select device.

11. The integrated structure of claim 1 wherein the conductive line comprises one or more of metal-containing compositions.

12. The integrated structure of claim 11 wherein the one or more of metal-containing compositions comprises metal carbide, metal nitride and metal silicide.

13. An integrated structure, comprising:
    alternating insulative levels and conductive levels vertically stacked;
    an opening defining opposing sidewalls through the alternating insulative levels and conductive levels;
    a conductive plug at a bottom of the opening, the conductive plug comprising an uppermost surface; and a channel liner comprising a composition the same as a composition of the conductive plug, the channel liner extending along the opposing sidewalls and against the uppermost surface of the conductive plug.

14. The integrated structure of claim 13 wherein the conductive plug is contained entirely in a single insulative level.

15. The integrated structure of claim 13 wherein the conductive plug is contained entirely in a lowermost insulative level.

16. The integrated structure of claim 13 further comprising a conductive line against the conductive plug.

17. The integrated structure of claim 13 wherein one conductive level defines a gate for a select device, and wherein an entirety of the conductive plug is below the gate for the select device.

18. The integrated structure of claim 13 wherein one conductive level defines a gate for a select device, and wherein an entirety of the channel liner against the conductive plug is below the gate for the select device.

19. An integrated structure, comprising:
a conductive line;
alternating insulative levels and conductive levels vertically stacked over the conductive line;
an opening defining opposing sidewalls through the alternating insulative levels and conductive levels; and
a channel liner exposed in the opening and extending along the opposing sidewalls and terminating elevationally above, and spaced from, the conductive line.

20. The integrated structure of claim 19 wherein the channel liner comprises vertically extending portions that are along the opposing sidewalls and horizontal portions that are the elevationally above, and spaced from, the conductive line, and wherein the vertically extending portions and horizontal portions are connected by step portions.

21. The integrated structure of claim 20 further comprising a dielectric liner under, and against, the step portions of the channel liner.

22. The integrated structure of claim 20 further comprising at least two dielectric liners under the step portions of the channel liner.

23. An integrated structure, comprising:
a conductive line comprising an upper surface;
alternating insulative levels and conductive levels vertically stacked over the conductive line;
an opening defining opposing sidewalls through the alternating insulative levels and conductive levels;
a channel liner extending along the opposing sidewalls and against at least a portion of the upper surface of the conductive line;
only one dielectric liner between the channel liner and the alternating insulative levels and conductive levels; and
wherein the single dielectric liner has a horizontal width in an upper portion of the opening which is greater than a horizontal width in a lower portion of the opening.

24. An integrated structure, comprising:
a conductive line comprising an upper surface;
alternating insulative levels and conductive levels vertically stacked over the conductive line;
an opening defining opposing sidewalls through the alternating insulative levels and conductive levels;
a channel liner extending along the opposing sidewalls and against at least a portion of the upper surface of the conductive line;
only one dielectric liner between the channel liner and the alternating insulative levels and conductive levels; and
wherein the single dielectric liner has a horizontal width in an upper portion of the opening which is greater than a horizontal width of the channel liner.

25. An integrated structure, comprising:
alternating insulative levels and conductive levels vertically stacked;
an opening defining opposing sidewalls through the alternating insulative levels and conductive levels;
a conductive plug at a bottom of the opening, the conductive plug comprising an uppermost surface;
a channel liner extending along the opposing sidewalls and against the uppermost surface of the conductive plug; and
wherein the conductive plug is contained entirely in a single insulative level.

26. An integrated structure, comprising:
alternating insulative levels and conductive levels vertically stacked;
an opening defining opposing sidewalls through the alternating insulative levels and conductive levels;
a conductive plug at a bottom of the opening, the conductive plug comprising an uppermost surface;
a channel liner extending along the opposing sidewalls and against the uppermost surface of the conductive plug; and
wherein the conductive plug is contained entirely in a lowermost insulative level.

27. An integrated structure, comprising:
alternating insulative levels and conductive levels vertically stacked;
an opening defining opposing sidewalls through the alternating insulative levels and conductive levels;
a conductive plug at a bottom of the opening, the conductive plug comprising an uppermost surface;
a channel liner extending along the opposing sidewalls and against the uppermost surface of the conductive plug; and
wherein one conductive level defines a gate for a select device, and wherein an entirety of the conductive plug is below the gate for the select device.

28. An integrated structure, comprising:
alternating insulative levels and conductive levels vertically stacked;
an opening defining opposing sidewalls through the alternating insulative levels and conductive levels;
a conductive plug at a bottom of the opening, the conductive plug comprising an uppermost surface;
a channel liner extending along the opposing sidewalls and against the uppermost surface of the conductive plug; and
wherein one conductive level defines a gate for a select device, and wherein an entirety of the channel liner against the conductive plug is below the gate for the select device.

29. An integrated structure, comprising:
a conductive line;
alternating insulative levels and conductive levels vertically stacked over the conductive line;
an opening defining opposing sidewalls through the alternating insulative levels and conductive levels;
a channel liner extending along the opposing sidewalls and terminating elevationally above, and spaced from, the conductive line; and
wherein the channel liner comprises vertically extending portions that are along the opposing sidewalls and horizontal portions that are the elevationally above, and spaced from, the conductive line, and wherein the vertically extending portions and horizontal portions are connected by step portions.

30. The integrated structure of claim 29 further comprising a dielectric liner under, and against, the step portions of the channel liner.

31. The integrated structure of claim 29 further comprising at least two dielectric liners under the step portions of the channel liner.

\* \* \* \* \*